United States Patent
Ritter

(10) Patent No.: US 11,942,934 B2
(45) Date of Patent: Mar. 26, 2024

(54) LEVEL CONVERTER AND CIRCUIT ARRANGEMENT COMPRISING SUCH LEVEL CONVERTERS

(71) Applicant: Robert Bosch GmbH, Stuttgart (DE)

(72) Inventor: Rudolf Ritter, Esslingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/793,764

(22) PCT Filed: Apr. 27, 2021

(86) PCT No.: PCT/DE2021/100381
§ 371 (c)(1),
(2) Date: Jul. 19, 2022

(87) PCT Pub. No.: WO2021/219167
PCT Pub. Date: Nov. 4, 2021

(65) Prior Publication Data
US 2023/0061922 A1 Mar. 2, 2023

(30) Foreign Application Priority Data
Apr. 29, 2020 (DE) ..................... 10 2020 205 403.7

(51) Int. Cl.
H03K 19/0175 (2006.01)
H03K 19/00 (2006.01)
H03K 19/0185 (2006.01)

(52) U.S. Cl.
CPC . *H03K 19/018528* (2013.01); *H03K 19/0005* (2013.01); *H03K 19/0175* (2013.01); *H03K 19/017509* (2013.01)

(58) Field of Classification Search
CPC ............. H03K 19/005; H03K 19/0175; H03K 19/017509; H03K 19/0185;
(Continued)

(56) References Cited

U.S. PATENT DOCUMENTS 8,022,765 B1 * 9/2011 Oo .......................... H03F 3/505
330/285
9,729,114 B2  8/2017 Astgimath
(Continued)

FOREIGN PATENT DOCUMENTS

EP  1791276 A1  5/2007
EP  3402071 A1  11/2018
(Continued)

OTHER PUBLICATIONS

International Search Report for PCT/DE2021/100381, dated Oct. 15, 2021.

*Primary Examiner* — Long Nguyen
(74) *Attorney, Agent, or Firm* — NORTON ROSE FULBRIGHT US LLP; Gerard A. Messina

(57) ABSTRACT

A level converter and circuit arrangement comprising such level converters. The level converter comprises a transistor, an impedance converter, an input voltage connection, an output voltage connection, and a power supply connection. The input voltage connection is connected to a gate terminal of the transistor. The output voltage connection is connected to a source terminal of the transistor and to the power supply connection. A first input terminal of the impedance converter is connected to the source connection or to the gate terminal of the transistor. An output terminal of the impedance converter is connected to the drain terminal of the transistor. The power supply connection is equipped to receive a current from a constant current source. The impedance converter is equipped to keep a source-drain voltage of the transistor at a predefined value using a reference voltage.

13 Claims, 2 Drawing Sheets

(58) Field of Classification Search
CPC ... H03K 19/018507; H03K 19/018514; H03K 19/018521; H03K 19/018528; H03F 1/32; H03F 1/3205; H03F 1/3211
See application file for complete search history.

(56) References Cited

U.S. PATENT DOCUMENTS

2010/0182086 A1    7/2010   Cozzolino
2011/0121859 A1    5/2011   Petrofsky

FOREIGN PATENT DOCUMENTS

EP        3402071 B1 *   11/2018
WO     9832222 A1     7/1998

* cited by examiner

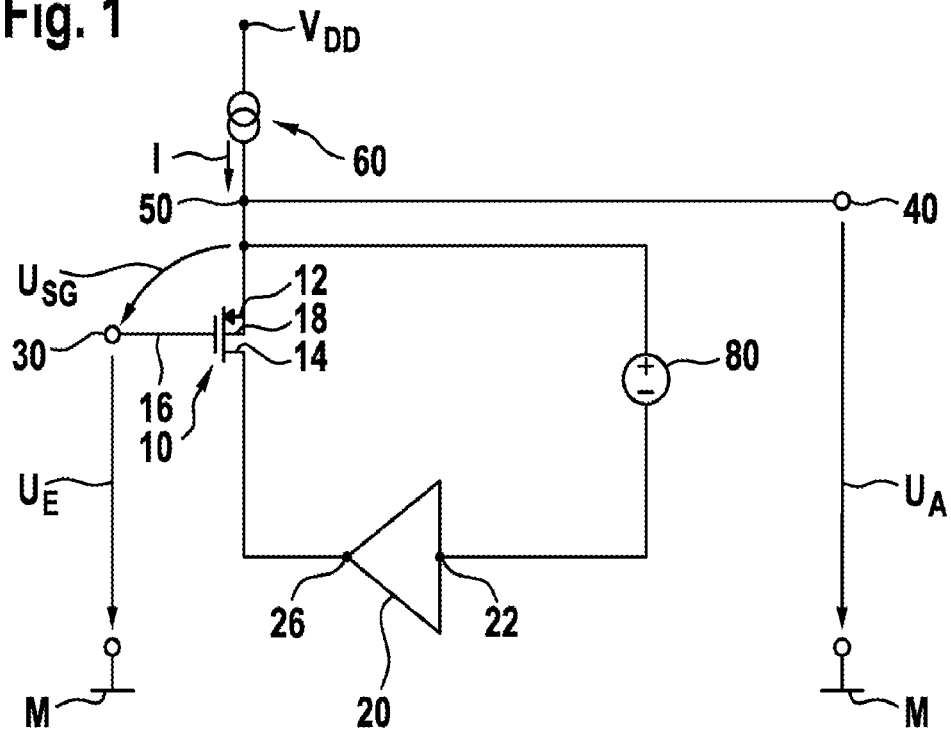
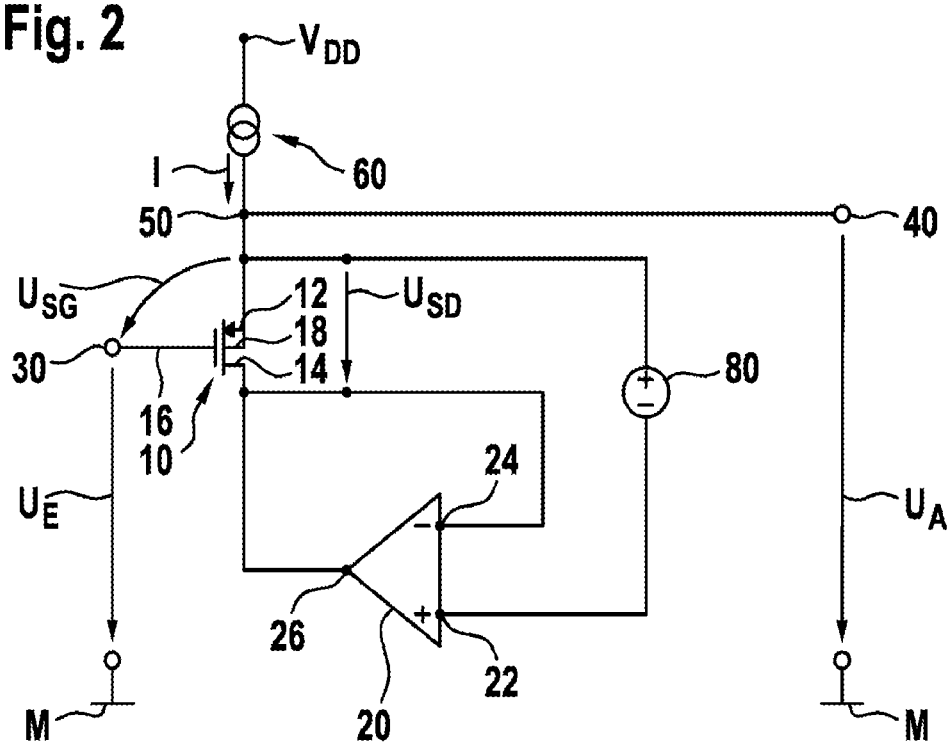

LEVEL CONVERTER AND CIRCUIT ARRANGEMENT COMPRISING SUCH LEVEL CONVERTERS

FIELD

The present invention relates to a level converter and circuit arrangement comprising such level converters, and in particular to a highly linear level converter with a high input impedance.

BACKGROUND INFORMATION

Analog level converters that are operated on the basis of a p-channel MOSFET or an n-channel MOSFET with a constant power supply and that have a high input impedance, since the gate of a MOSFET in the first order is only capacitive, are described in the prior art. The linearity of such a level converter is determined by the stability of the voltage $U_{SG}$ (voltage between source and gate). This is dependent on the threshold voltage $U_T$, which can be kept constant with a suitable bulk terminal. Furthermore, $U_{SG}$ is dependent on the drain current $I_D$, which is likewise constant. The dependency of the source-drain voltage $U_{SD}$ of a level converter of this kind that is conventional in the related art, on the other hand, is not constant, which in turn results in a dependency of $U_{SG}$ with reference to an input voltage $U_E$. A possible use of such MOSFET-based level converters with a correspondingly high input impedance may thus be limited in highly linear circuits.

Further conventional circuits for level conversion, on the other hand, have a low input impedance (e.g. using an R2R network), or cannot be measured close to the power supplies (e.g. using a current/resistance level converter).

It is an object of the present invention to provide a level converter that is capable of stabilizing an operating point of a transistor, and in particular a MOSFET, in such a way that a high overall linearity of a level converter of this kind is achieved, while the level converter has a high input impedance and ability to be measured against a power supply. It is furthermore an object of the present invention to provide a circuit arrangement comprising level converters of this kind that is capable of further improving the high linearity of the level converter according to the present invention.

SUMMARY

According to a first aspect of the present invention, a level converter, and in particular a level converter having a high linearity and a high input impedance, is provided. The level converter comprises a transistor that, because of a high input impedance and a low output impedance, is preferably an n-channel MOSFET or a p-channel MOSFET, while not thereby restricting the type of transistors usable in this connection to those aforementioned. Instead, it is for example also possible to use an npn bipolar transistor, a pnp bipolar transistor, an re-channel JFET, a p-channel JFET, an n-channel FinFET, a p-channel FinFET, or a type of transistor that differs therefrom in conjunction with the level converter according to the present invention. It should be pointed out that respective complementary transistor types (e.g. p-channel/n-channel MOSFETs) can be used in a way obvious to the person skilled in the art by suitable adaptations of the circuit of the level converter according to the present invention, which is why a more detailed description thereof will be dispensed with in order to avoid repetition. It should likewise be pointed out that above-mentioned further usable transistor types for the person skilled in the art can likewise be integrated in the level converter according to the present invention as an alternative to a MOSFET, which is why a more detailed description of the use thereof will likewise be dispensed with. For the purpose of a simplified description, the level converter according to the present invention will be described below representatively with the aid of the MOSFET, which is particularly suitable, using its specific terminal designations (source, gate, drain). Terminal designations of other transistor types that differ from this may again be transferred to other transistor types for the person skilled in the art.

The level converter according to an example embodiment of the present invention furthermore comprises an impedance converter, an input voltage connection, an output voltage connection and a power supply connection. The input voltage connection is connected to a gate terminal of the transistor and is equipped to be connected to an input voltage that is to be shifted by the level converter.

It should be pointed out in this connection that respective connections of the level converter according to the present invention do not necessarily have to be physically present, separate connections. Thus for example the input voltage connection and the gate terminal may be one and the same physical connection. This also applies to connections of the level converter according to the present invention that are described below and are connected directly together electrically. For an easily comprehensible description, the respective connections are designated and described in accordance with their respective functional purposes and not necessarily in accordance with their actual physical manifestations.

The input voltage that is to be shifted or converted by the level converter may for example be an input voltage related to a reference potential (e.g., a ground potential) of the level converter. The output voltage connection of the level converter is connected to a source terminal of the transistor and to the power supply connection, and is equipped to provide the input voltage that is to be shifted by the level converter as an output voltage of the level converter.

Furthermore, a first input terminal of the impedance converter is connected to the source terminal or the gate terminal of the transistor. An output terminal of the impedance converter is connected to the drain terminal of the transistor. The power supply connection is further equipped to receive a current from a constant current source. The impedance converter finally is equipped to keep a source-drain voltage of the transistor at a predefined value using a reference voltage (or alternatively setpoint voltage).

A source-drain voltage that is kept constant in this way, in combination with a constant drain current and a predefined threshold voltage of the transistor, can accordingly lead to a constant source-gate voltage, as a result of which a very high linearity of the present level converter circuit can be achieved while ensuring a high input impedance. Likewise, on the basis of a level converter of this kind an ability to be measured against a power supply (e.g. ground) and beyond can be realized.

Preferred further developments of the present invention are disclosed herein.

In accordance with an example embodiment of the present invention, the reference voltage is advantageously provided on the basis of a voltage source (e.g. an externally attached voltage source) upstream from the first input terminal of the impedance converter.

Furthermore advantageously, in accordance with an example embodiment of the present invention, the impedance converter is realized on the basis of a differential amplifier, with the first input terminal of the impedance converter in this case corresponding to a positive input terminal of the differential amplifier. A second input terminal of the impedance converter, which corresponds to a negative input terminal of the differential amplifier, is in this case connected to the drain terminal of the transistor. It should be pointed out that the impedance converter is explicitly not limited to a use of a differential amplifier (or an operational amplifier), and that discrete and/or integrated circuits and/or components, all of which differ therefrom, can be used instead in order to keep the source-drain voltage of the transistor at the predefined voltage value.

In the case of a differential amplifier being used as the impedance converter, it is particularly advantageous to provide the reference voltage on the basis of a predefined voltage offset between the positive and the negative signal path of the differential amplifier. The particular advantage is yielded, among other things, in that a variant of this kind for generating the reference voltage can be integrated in an integrated circuit in a very simple way.

In the case of a differential amplifier being used as the impedance converter, the predefined voltage offset between the positive and the negative signal path of the differential amplifier can be achieved in the two signal paths of the differential amplifier for example using different resistors and/or different voltage sources and/or different power sources and/or using transistors having different characteristics. In one advantageous configuration, for example the power supply of the negative signal path of the differential amplifier can be connected to the negative signal path by way of a resistor, so that the signal ensures a voltage drop and consequently leads to a voltage offset between the two signal paths. Alternatively or additionally, a resistor may be arranged in the positive signal path too, where a resistance value in the negative signal path in conjunction with the circuit design described here ought always to be greater than a resistance value in the positive signal path. As a further alternative or additionally, the resistor or resistors and/or the above-mentioned further measures for generating the voltage offset may also be arranged at other suitable positions within the differential amplifier. What is crucial in the context of the level converter according to the present invention is that, using a respective measure, an asymmetry between the two signal paths is produced that preferably results in the desired voltage offset. It should be pointed out that, for the alternatively or additionally proposed use of different voltage sources and/or power sources, it applies analogously to the use of different resistors that they either may each be arranged only in one of the two signal paths, or in both of the signal paths with properties which differ from each other (voltage levels, current intensities, etc.).

Further, the level converter according to the present invention may be realized as a fully integrated circuit and/or as a discrete circuit and thus also as a partially integrated circuit. For example, the level converter described above may be a component of an ASIC.

A further improvement in the linearity of the level converter of the present invention can be attained in that a bulk-source voltage of the transistor corresponds to a predefined potential difference. Particularly preferably, the predefined potential difference may correspond to a potential difference of 0 V, with in this case the source terminal of the transistor being able to be bypassed with a bulk terminal of the transistor.

Advantageously, in accordance with an example embodiment of the present invention, the impedance converter may substantially have a voltage amplification of one and/or be realized as a unity-gain amplifier (buffer) on the basis of a differential amplifier. It should be pointed out that as accurate as possible an approximation of the voltage amplification to the factor of one within the meaning of the present invention is particularly advantageous, but that an improvement in the linearity of the level converter according to the present invention compared with a level converter with high input impedance from the related art can also be achieved if the voltage amplification should have a value other than one.

The level converter according to the present invention may in principle be used in any circuits whatsoever that require a level conversion with high linearity with a simultaneously high input impedance and possibly a low output impedance. Circuits of this kind may for example be circuits for current measurement technology and/or circuits of a battery management system (e.g. for a means of locomotion). Furthermore, the level converter may also be used in circuits that do not, or only partially, require the advantageous properties of the level converter according to the present invention.

According to a second aspect of the present invention, a circuit arrangement is provided that comprises level converters described above. Specifically, in accordance with an example embodiment of the present invention, the circuit arrangement comprises a first level converter and a second level converter in accordance with the above description. The first level converter is equipped to shift a positive input signal that is related to a negative input signal by a predefined level, while the second level converter is equipped to shift the negative input signal by the same predefined level. For this, the first level converter and the second level converter may ideally be constructed identically. Further, the circuit arrangement is equipped to be used for a differential measurement between a positive output signal of the first level converter and a negative output signal of the second level converter. The negative input signal may for example be a negative signal of a differential signal transmission or alternatively a reference potential such as a common ground potential of the circuit arrangement according to the present invention. By the level conversion both of the positive input signal and also of the negative input signal each by the same value, it is possible to prevent a desired predefined value for the level shift from deviating from the predefined value in a real circuit because of physical marginal conditions. This is achieved in that both level converters, owing to their being configured as identically as possible (presuppposing as low component tolerances as possible), in a similar way have a potential deviation from the predefined value of the level shift. In the case of a differential measurement of the respective output signals of the two level converters, the substantially uniform deviations of the two level converters thus do not have any effect, or have a clearly reduced effect, whereby a further improvement for a level conversion can be achieved on the basis of the present circuit arrangement.

In addition to as identical as possible a configuration of the two level converters, it may be particularly advantageous to arrange the first level converter and the second level converter in such a way within an overall circuit that environmental effects (in particular temperature fluctuations) have a substantially uniform effect on the first level converter and the second level converter. Depending on the configuration of the overall circuit, it may be advantageous to arrange the first level converter and the second level converter in the immediate vicinity of each other, so that locally occurring temperature effects, or environmental effects which differ from them, have a more or less identical effect on both level converters.

Alternatively, the two level converters may also be arranged at positions in an overall circuit which are spaced apart from each other if the environmental effects on the respective arrangement positions, despite the spacing, have a uniform effect on these positions and hence on the level converters arranged at these positions.

BRIEF DESCRIPTION OF THE DRAWINGS

Below, example embodiments of the present invention will be described in detail with reference to the figures.

FIG. 1 is a circuit diagram of a specific embodiment of a level converter according to the present invention.

FIG. 2 is a circuit diagram of a further specific embodiment of a level converter according to the present invention.

DETAILED DESCRIPTION OF EXAMPLE EMBODIMENTS

Figure 3:
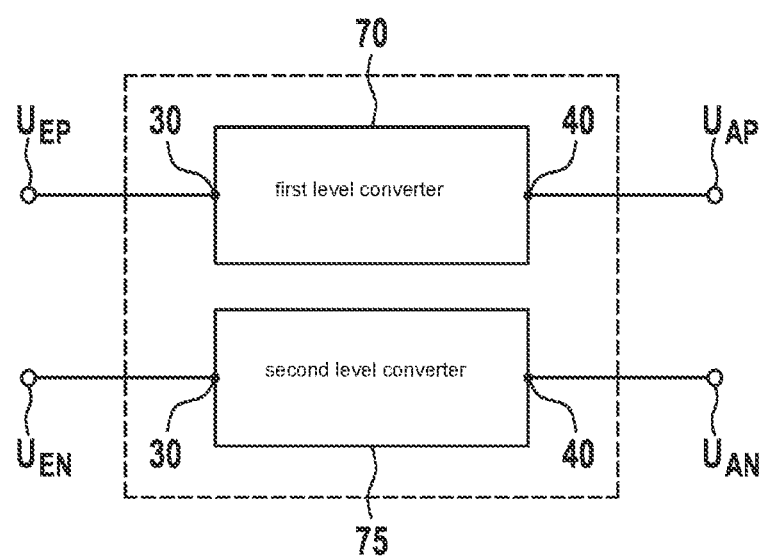
FIG. 3 is a circuit diagram of an exemplary circuit arrangement for a differential voltage measurement on the basis of a level converter according to the present invention.

FIG. 1 is a circuit diagram of a specific example embodiment of a level converter according to the present invention. The level converter here comprises a p-channel MOSFET 10 (abbreviated below to "PMOS 10"), the source terminal 12 of which is bypassed with a bulk terminal 18 of the PMOS 10, as a result of which a source-gate voltage $U_{SG}$ of the PMOS 10 is kept substantially constant. A gate terminal 16 of the PMOS 10 is connected to an input voltage connection 30 by way of which an input voltage $U_E$ related to a ground potential M of the level converter is fed in, the level of which input voltage is raised by 2 V here using the level converter. An output voltage connection 40 of the level converter is connected to the source terminal 12 of the PMOS 10 and to a power supply connection 50, and is equipped to provide the input voltage $U_E$ raised by 2 V by the level converter as output voltage $U_A$. The power supply connection 50 is connected to a first connection of a constant current source 60 that provides a constant current I. For this, the constant current source 60 is connected to a second connection with a positive supply voltage $V_{DD}$. The source terminal 12 is furthermore connected to a first connection of a reference voltage source 80 that provides a predefined constant reference voltage. A second connection of the reference voltage source 80 is connected to a first input terminal 22 of an impedance converter 20. An output terminal 26 of the impedance converter 20 is connected to a drain terminal 14 of the PMOS 10. The impedance converter 20 is equipped to keep a source-drain voltage $U_{SD}$ of the PMOS 10 at a predefined value using the reference voltage.

FIG. 2 shows a circuit diagram of a further specific embodiment of a level converter according to the present invention. It should be pointed out that, owing to the similarities between the specific embodiments of the level converter according to the present invention in FIGS. 1 and 2, in order to avoid repetition only the differences between the two figures will be described below. The impedance converter 20 in the specific embodiment shown in FIG. 2 is implemented on the basis of a differential amplifier. The first input terminal of the impedance converter 20 thus corresponds here to a positive input terminal 22 of the differential amplifier. A second input terminal of the impedance converter corresponds to a negative input terminal 24 of the differential amplifier. The negative input terminal 24 of the differential amplifier is connected to a drain terminal 14 of the PMOS 10.

FIG. 3 shows a circuit diagram of an exemplary circuit arrangement for a differential voltage measurement on the basis of the level converter according to the present invention. The circuit arrangement is marked using the broken line in FIG. 2 and comprises a first level converter 70 and a second level converter 75 that are constructed identically and are arranged here in the immediate vicinity of each other in an integrated circuit. A positive input signal $U_{EP}$, which is related to a negative input signal $U_{EN}$, is fed into an input voltage connection 30 of the first level converter 70. A negative input signal $U_{EN}$, which is related to the positive input signal $U_{EP}$, is fed into an input voltage connection 30 of the second level converter 75. Both level converters 70, 75 raise the input signals $U_{EP}$ and $U_{EN}$ each by the same value. By way of an output voltage connection 40 of the first level converter 70, a correspondingly level-shifted positive output signal $U_{AP}$ is emitted which corresponds to a negative output signal $U_{AN}$ of an output voltage connection 40 of the second level converter 75.

What is claimed is:

1. A level converter for a circuit arrangement, comprising:
   a transistor;
   an impedance converter;
   an input voltage connection;
   an output voltage connection; and
   a power supply connection;
   wherein:
      the input voltage connection is connected to a gate terminal of the transistor and is configured to be connected to an input voltage that is to be shifted by the level converter,
      the output voltage connection is connected to a source terminal of the transistor and to the power supply connection and is configured to provide the input voltage that is to be shifted by the level converter as an output voltage,
      a first input terminal of the impedance converter is connected to the source terminal of the transistor,
      an output terminal of the impedance converter is connected to a drain terminal of the transistor,
      the power supply connection is configured to receive a current from a constant current source, and
      the impedance converter is configured to keep a source-drain voltage of the transistor at a predefined value using a reference voltage;
   wherein the circuit arrangement includes the level converter and another level converter, which is constructed identically to the level converter, and which are arranged together in an integrated circuit, wherein a positive input signal, which is related to a negative input signal, is fed into the input voltage connection of the level converter, wherein the negative input signal, which is related to the positive input signal, is fed into an input voltage connection of the another level converter,
   wherein both the level converter and the another level converter raise the negative input signal and the positive input signal each by the same value, and wherein by the output voltage connection of the level converter, a correspondingly level-shifted positive output signal is emitted which corresponds to a negative output signal of an output voltage connection of the another level converter.

2. The level converter as recited in claim 1, wherein the transistor is a MOSFET.

3. The level converter as recited in claim 1, wherein the transistor is:
   (i) a p-channel MOSFET or an n-channel MOSFET, or
   (ii) an npn bipolar transistor or a pnp bipolar transistor, or
   (iii) an n-channel JFET or a p-channel JFET, or
   (iv) a p-channel FinFET or an n-channel FinFET.

4. The level converter as recited in claim 1, wherein the reference voltage is provided based on a voltage source upstream from the first input terminal of the impedance converter.

5. The level converter as recited in claim 1, wherein the impedance converter includes a differential amplifier, the first input terminal of the impedance converter corresponds to a positive input terminal of the differential amplifier, and a second input terminal of the impedance converter, which corresponds to a negative input terminal of the differential amplifier, is connected to the drain terminal of the transistor.

6. The level converter as recited in claim 5, wherein the reference voltage is based on a predefined voltage offset between a positive input and a negative input of the differential amplifier of the impedance converter.

7. The level converter as recited in claim 6, wherein the predefined voltage offset is achieved in a positive signal path and a negative signal path of the differential amplifier based on the voltage source and a type of the transistor.

8. The level converter as recited in claim 1, wherein a bulk-source voltage of the transistor corresponds to a predefined potential difference.

9. The level converter as recited in claim 8, wherein the potential difference is 0 V.

10. The level converter as recited in claim 1, wherein the impedance converter has substantially a voltage amplification of one.

11. The level converter as recited in claim 1, wherein the level converter is used in a battery management system, or in conjunction with a current measurement circuit.

12. A circuit arrangement, comprising:
   a first level converter, and a second level converter, each of which includes:
      a transistor;
      an impedance converter;
      an input voltage connection;
      an output voltage connection; and
      a power supply connection;
   wherein:
      the input voltage connection is connected to a gate terminal of the transistor and is configured to be connected to an input voltage that is to be shifted by the level converter,
      the output voltage connection is connected to a source terminal of the transistor and to the power supply connection and is configured to provide the input voltage that is to be shifted by the level converter as an output voltage,
      a first input terminal of the impedance converter is connected to the source terminal of the transistor,
      an output terminal of the impedance converter is connected to a drain terminal of the transistor,
      the power supply connection is configured to receive a current from a constant current source, and
      the impedance converter is configured to keep a source-drain voltage of the transistor at a predefined value using a reference voltage,
   wherein:
      the first level converter is configured to shift a positive input signal that is related to a negative input signal by a predefined level,
      the second level converter is configured to shift the negative input signal by the same predefined level as the first level converter, and
      the circuit arrangement is configured to be used for a differential measurement between a positive output signal of the first level converter and a negative output signal of the second level converter;
   wherein the circuit arrangement includes the first level converter and the second level converter that are arranged together in an integrated circuit, wherein a positive input signal, which is related to the negative input signal, is fed into the input voltage connection of the first level converter, wherein the negative input signal, which is related to the positive input signal, is fed into the input voltage connection of the second level converter, and
   wherein both the level converters raise the negative input signal and the positive input signal each by the same value, and wherein by the output voltage connection of the first level converter, a correspondingly level-shifted positive output signal is emitted which corresponds to a negative output signal of the output voltage connection of the second level converter.

13. The circuit arrangement as recited in claim 12, wherein the first level converter and the second level converter are arranged so that environmental effects on the first level converter and on the second level converter have a substantially uniform effect on the first and second level converters.

* * * * *